United States Patent [19]
Kim

[11] Patent Number: 5,879,995
[45] Date of Patent: Mar. 9, 1999

[54] HIGH-VOLTAGE TRANSISTOR AND MANUFACTURING METHOD THEREFOR

[75] Inventor: Jhang-rae Kim, Suwon, Rep. of Korea

[73] Assignee: Samsung Electronics Co., Ltd., Kyungki-Do, Rep. of Korea

[21] Appl. No.: 613,240

[22] Filed: Mar. 8, 1996

Related U.S. Application Data

[62] Division of Ser. No. 441,838, May 16, 1995, Pat. No. 5,567,965.

[30] Foreign Application Priority Data

May 16, 1994 [KR] Rep. of Korea ...................... 94-10668

[51] Int. Cl.⁶ .................................................. H01L 21/28
[52] U.S. Cl. .......................... 438/286; 438/197; 438/948
[58] Field of Search ................... 437/27, 29, 30, 437/36, 40 AS, 40 GS, 41 AS, 41 GS, 44, 46; 438/286, 289, 303, 305, 307, 942, 948

[56] References Cited

U.S. PATENT DOCUMENTS

| | | | |
|---|---|---|---|
| 4,682,404 | 7/1987 | Miller et al. | |
| 4,728,617 | 3/1988 | Woo et al. | 437/30 |
| 4,746,624 | 5/1988 | Cham et al. | |
| 4,833,097 | 5/1989 | Butler et al. | 437/29 |
| 4,878,100 | 10/1989 | McDavid | |
| 5,015,598 | 5/1991 | Verhaar | |
| 5,120,668 | 6/1992 | Hsu et al. | 437/44 |
| 5,147,814 | 9/1992 | Takeuchi | 437/44 |
| 5,292,676 | 3/1994 | Manning | 437/46 |
| 5,427,971 | 6/1995 | Lee et al. | 437/44 |
| 5,442,215 | 8/1995 | Chae | |
| 5,543,342 | 8/1996 | Mukai et al. | 437/40 |
| 5,550,069 | 8/1996 | Roth | 437/44 |
| 5,578,509 | 11/1996 | Fujita | 437/40 |
| 5,604,139 | 2/1997 | Codama et al. | 437/36 |

FOREIGN PATENT DOCUMENTS

| | | |
|---|---|---|
| 60-133756 | 7/1985 | Japan . |
| 60-177677 | 9/1985 | Japan . |
| 61-214473 | 9/1986 | Japan . |
| 1084667 | 3/1989 | Japan . |
| 2280342 | 11/1990 | Japan . |
| 5267327 | 10/1993 | Japan . |

OTHER PUBLICATIONS

S. Wolf & R.N. Tauber "Silicon Processing for the VLSI Era" vol. I, pp. 321–325, 1986.
D.A. Badami et al., IBM Tech. Discl. Bulletin 26(6)(1983)2682 "Tapered photoresist for a doping profile", Nov. 1983.
S. Wolf, "Silicon Processing for the VLSI Era" vol. II, pp. 354–359, Jun. 1990.

*Primary Examiner*—Charles Bowers
*Assistant Examiner*—Martin Sulsky
*Attorney, Agent, or Firm*—Pillsbury Madison & Sutro LLP

[57] ABSTRACT

A fourth impurity region having a smaller junction depth than that of the second impurity region, and having a third impurity concentration which is lower than that of the second impurity region is formed between the first impurity region and second impurity region. A fifth impurity region whose junction depth is smaller than that of the second impurity region, and having a third impurity concentration is formed between the first impurity region and second impurity region. Since the intensity of the electric field applied to the drain region is reduced, transistor characteristics are improved. Also, the integration of a semiconductor device is increased by reducing the layout space.

15 Claims, 3 Drawing Sheets

“5,879,995”

HIGH-VOLTAGE TRANSISTOR AND MANUFACTURING METHOD THEREFOR

This is a division of application Ser. No. 08/441,838, filed May 16, 1995, now U.S. Pat. No. 5,567,965.

BACKGROUND OF THE INVENTION

The present invention relates to a metal-oxide semiconductor (MOS) transistor, and more particularly, to a high-voltage transistor which can reduce layout space and provide improved characteristics thereof, and a manufacturing method therefor.

With increased integration of semiconductor devices, the channel length of a MOS transistor becomes shorter. Thus, short-channel effects such as reduced threshold voltage, deteriorated sub-threshold characteristics and reduced source-drain breakdown voltage have been a serious impediment to the high-integration of semiconductor devices. Therefore, research into new structures for remedying these short-channel effects is under progress. Particularly, structures have been developed which increase the breakdown voltage of a MOS transistor.

FIG. 1 is a cross-sectional view of a transistor having a high breakdown voltage, which is disclosed in U.S. Pat. No. 4,172,260.

Referring to FIG. 1, a first oxide film (not shown) is formed on a P-type semiconductor substrate 1 by a thermal oxidation. After selectively etching the first oxide film, an $N^+$-type impurity is diffused into the substrate 1 to form an $N^+$-type source region 7 and drain region 6. The first oxide film is removed and a thermal oxidizing process is conducted to form a second oxide film 2 on the substrate 1. After depositing a polycrystalline silicon (polysilicon) on the second oxide film 2, the polysilicon layer is patterned by a photolithographic etching process to form a gate electrode 3. Then, using gate electrode 3 as a mask, $N^-$-type impurity ions are implanted to form an $N^-$-type register region 8. At this time, the dose of the $N^-$-type impurity is an important parameter to determine the breakdown voltage. A third oxide film (not shown) which extends from on the gate electrode 3 toward the drain region 6 and which terminates at an intermediate position of the resistor region 8 is formed. Using the gate electrode 3 and the third oxide film as a mask, N-type impurity ions are implanted to form an N-type intermediate region 5. Thus, the register region 8 is segmented into $N^-$-type region 4 and N-type intermediate region 5. Subsequently, after removing the third oxide film, a passivation film (not shown) is formed on the resultant structure, and a contact process for exposing the source region 7 and drain region 6 is conducted.

According to the aforementioned conventional method, since the width of a depletion layer formed near the drain region is made large by forming $N^-$- and N-type regions between the $N^+$-drain region of a transistor and gate electrode 3, the electrical field applied to the drain region is reduced. As a result, however, the layout space is increased by as much as the offset length corresponding to the $N^-$- and N-type regions, which is disadvantageous for high-integration.

Meanwhile, a method for obtaining a high breakdown voltage without increasing layout space is disclosed in U.S. Pat. No. 4,950,617. In this method, an electric field is reduced by manufacturing a transistor having a doubly diffused drain (DDD) structure, as shown in FIG. 2.

Referring to FIG. 2, a gate insulation film 11 is formed on a P-type semiconductor substrate 10 by a thermal oxidizing process. Subsequently, polysilicon is deposited thereon and patterned by a photolithographic etching process to form a gate electrode 12. Using the gate electrode 12 as a mask, $N^-$-type impurity ions are implanted. Next, $N^-$ source and drain regions 14 and 14' in which a deep junction is diffused are formed by conducting a thermal treatment at a high temperature for a long time. Using the gate electrode 12 again as a mask, $N^+$-impurity ions are again implanted, thereby forming $N^+$ source and drain regions 13 and 13'.

According to the conventional method having the aforementioned DDD transistor, a high-temperature and long-duration thermal treatment is necessary for forming a deep junction of the regions 14 and 14', which results in lowered transistor performance and short-channel effects. Therefore, in order to solve the problem, the channel length of the transistor should be increased, which makes it difficult to adopt the method shown in FIG. 2 for a highly integrated semiconductor device.

SUMMARY OF THE INVENTION

Therefore, it is an object of the present invention to provide a high-voltage transistor which can reduce layout space and improve performance characteristics thereof.

It is another object of the present invention to provide a method for manufacturing the high-voltage transistor specifically suitable for manufacturing the above transistor.

To accomplish the above object, there is provided a transistor according to the present invention comprising: a semiconductor substrate of a first conductivity type; a gate electrode formed by interposing a gate insulation film on the semiconductor substrate; an insulation spacer formed on the sidewalls of the gate electrode; a first impurity region of a first conductivity type formed on the substrate surface under the gate electrode and having a first impurity concentration; a pair of second impurity regions of a second conductivity type, being opposite to the first conductivity type, formed on the left and right of the first impurity region, respectively, and having a second impurity concentration; a pair of third impurity regions formed between the first and second impurity regions, having a smaller junction depth than that of the second impurity region and a third impurity concentration lower than that of the second impurity region; and a pair of fourth impurity regions aligned with the insulation spacer, respectively embedded in and having a higher concentration than the pair of second impurity regions.

According to an embodiment of the present invention, the third impurity region has a width which extends 0.21~1.0 μm from the edge of the gate electrode toward the center thereof. Also, the insulation spacer is formed so as to cover the upper surface of each second impurity region not being contacted with each fourth impurity region. The first conductivity type is an N-type and the second conductivity type is a P-type, or vice versa. In the latter case, phosphorus may be used as the impurity of the second and third impurity regions and arsenic may be used as that of the fourth impurity region.

Also, to accomplish the first object of the present invention, there is provided a MOS transistor comprising: a semiconductor substrate of a first conductivity type; a gate electrode formed by interposing a gate insulation film on the semiconductor substrate; an insulation spacer formed on the sidewalls of the gate electrode; a first impurity region of the first conductivity type formed on the substrate surface under the gate electrode and having a first impurity concentration; a second impurity region of a second conductivity type, being opposite to the first conductivity type, contacting one side of the first impurity region and having a second impurity concentration being higher than the first impurity concentration; a third impurity region of the second conductivity type formed on the other side of the first impurity region and having a third impurity concentration being higher than the second impurity concentration; a fourth impurity region of the second conductivity type formed between the first impurity region and third impurity region, with contacting the other side of the first impurity region, and having a fourth impurity concentration being lower than the second impurity concentration; a fifth impurity region of the second conductivity type by which the third impurity region is surrounded with a junction portion thereof being formed below the third impurity region, contacting the fourth impurity region, and having the second impurity concentration; a sixth impurity region of the second conductivity type aligned with one insulation spacer for the junction portion thereof to contact the second impurity region and having a fifth impurity concentration being higher than the second impurity concentration; and a seventh impurity region of the second conductivity type aligned with the other insulation spacer for the junction portion thereof to contact the third impurity region.

According to a preferred embodiment of the present invention, the fourth impurity region has a width of 0.2~1.0 $\mu$m which extends from the edge of the gate electrode toward the center thereof, and the insulation spacer is formed so as to cover the upper surface of the second impurity region with which the sixth impurity region is not contacted and the upper surface of the third impurity region with which the seventh impurity region is not contacted. Also, Phosphorus may be used as the impurity of the second to fifth impurity regions and arsenic is used as the impurity of the sixth and seventh impurity regions. Conversely, phosphorus may be used as the impurity of the fourth and fifth impurity regions and arsenic may be used as the impurity of the second, third, sixth and seventh impurity regions.

To accomplish the second object of the present invention, the method according to the present invention comprises the steps of: implanting first impurity ions of a first conductivity type on a semiconductor substrate of the first conductivity type, to form a first impurity region of a first impurity concentration thereon; sequentially forming a gate insulation film and a gate electrode on the semiconductor substrate; forming a photoresist pattern on the gate electrode, each side of the photoresist pattern being at a first predetermined distance from the edges of the gate electrode toward the center thereof for masking the gate electrode; implanting second impurity ions of a second conductivity type, being opposite to the first conductivity type, on the resultant structure on which the photoresist pattern is formed, to form a pair of second impurity regions having a second impurity concentration into the semiconductor substrate, and at the same time forming a pair of third impurity regions contacting the pair of second impurity regions, having a width which extends from both edges of the gate electrode toward the center thereof by the predetermined distance and having a third impurity concentration being lower than the second impurity concentration; removing the photoresist pattern; forming an insulation spacer on the sidewalls of the gate electrode; and implanting third impurity ions of the second conductivity type on the resultant structure on which the insulation spacer is formed to form a pair of fourth impurity regions having a fourth impurity concentration being higher than the second impurity concentration.

According to this embodiment of the present invention, the third impurity concentration of the third impurity regions is preferably higher than the first impurity concentration of the first impurity region. The first predetermined distance is preferably 0.2~1.0 $\mu$m. Phosphorus is preferably used as the second impurity and arsenic is preferably used as the third impurity.

Also, to accomplish the second object of the present invention, the method according to the present invention comprises the steps of: implanting first impurity ions of a first conductivity type on a semiconductor substrate of the first conductivity type, to form a first impurity region of a first impurity concentration thereon; sequentially forming a gate insulation film and a gate electrode on the semiconductor substrate; implanting second impurity ions of a second conductivity type, being opposite to the first conductivity type, on the resultant structure on which said gate insulation film and gate electrode are formed, to form second and third impurity regions in the semiconductor substrate, each having a second impurity concentration and a third impurity concentration being higher than the second impurity concentration; forming a photoresist pattern to cover the part of the gate electrode and the substrate where the second impurity region is formed and to expose the other part of the gate electrode and the substrate where the third impurity region is formed; implanting third impurity ions of the second conductivity type on the resultant structure on which the photoresist pattern is formed, to form a fourth impurity region having the fourth impurity concentration on the semiconductor substrate and having a first distance extending from one edge of the gate electrode near the third impurity region toward the center thereof, and at the same time forming a fifth impurity region surrounding the third impurity regions with a junction portion thereof being formed under the third impurity region, contacting the fourth impurity region, and having the second impurity concentration; removing the photoresist pattern; forming an insulation spacer on the sidewalls of the gate electrode; and implanting fourth impurity ions of the second conductivity type on the resultant structure on which the insulation spacer is formed, to form sixth and seventh impurity regions having a fifth impurity concentration being higher than the second impurity concentration.

According to this embodiment of the present invention, the third impurity concentration of the fourth impurity region is preferably higher than the first impurity concentration of the first impurity region. Phosphorus is preferably used as the second and third impurities and arsenic is preferably used as the fourth impurity. Also, phosphorus is preferably used as the third impurity and arsenic is preferably used as the second and fourth impurities.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 3:
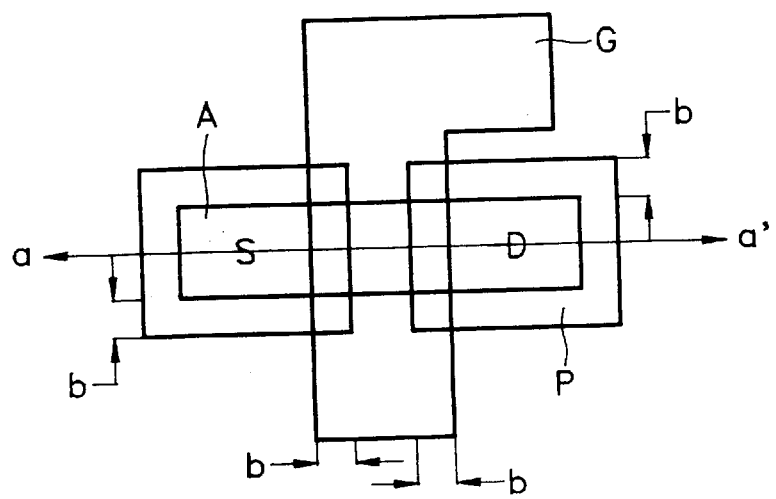
FIG. 3 is a plan view of a high-voltage transistor according to an embodiment of the present invention.

In FIG. 3, reference letter A designates an active region pattern, G designates a gate pattern, S designates a source region, D designates a drain region and P designates a source/drain ion implantation pattern.

As shown in FIG. 3, the source/drain pattern P according to the present invention is formed on the gate pattern G and both patterns P and G are overlapped by a distance b.

Figure 4:
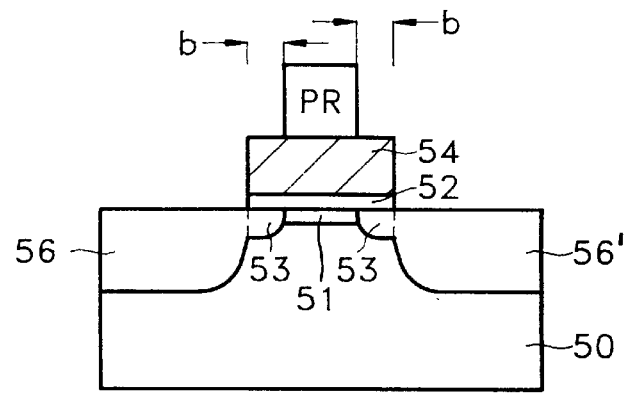
FIGS. 4 and 5 are cross-sectional views along a line aa' of FIG. 3 for explaining a method for manufacturing the high-voltage transistor according to an embodiment of the present invention.
Figure 5:
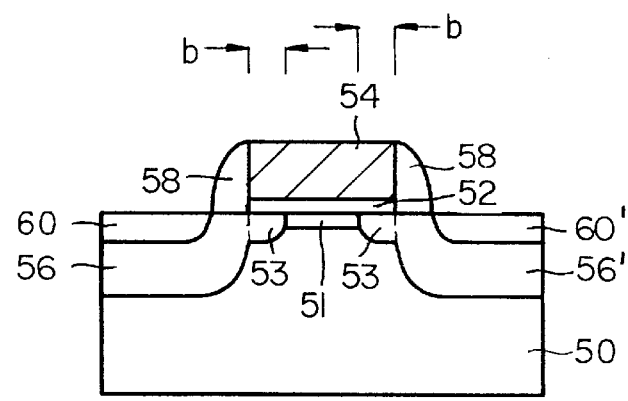

FIGS. 4 and 5 are cross-sectional views along a line aa' of FIG. 3 for explaining a method for manufacturing the high-voltage transistor according to an embodiment of the present invention.

FIG. 4 shows a process of forming $N^-$-type source/drain 56 and 56' and $N^{--}$-type source/drain 53. A device isolation region (not shown) for defining an active-region on a P-type semiconductor substrate 50 is selectively formed. Next, by implanting P-type impurity ions using the device isolation region as a mask, an impurity region 51 for controlling a threshold voltage is formed on the surface of the substrate 50 of the active region. Subsequently, an insulating material is formed on the substrate 50 by a thermal oxidizing process and a conductive material, e.g., polysilicon, is successively deposited on the insulating material to form a conductive layer. Next, the conductive layer and the insulating material are patterned by a photolithographic etching process to form a gate electrode 54 and a gate insulation film 52. A photoresist pattern PR is formed on the resultant structure so as to mask the gate electrode 54, each side of the photoresist pattern being at a first predetermined distance b, e.g., 0.2~1.0 $\mu$m, from the edges of the gate electrode 54 toward the center of the gate electrode 54. Subsequently, using the photoresist pattern PR as a mask, $N^-$-type impurity ions, e.g., phosphorus ions, are implanted with a high energy. Therefore, N source and drain regions 56 and 56' and $N^{--}$ source/drain region 53 are formed on the substrate 50 at the same time.

The $N^{--}$ source/drain region 53 is a tail portion of impurity profile produced by a high energy ion implantation and has a width extending from both edges of the gate electrode 54 toward the center thereof by a first predetermined distance b, and is formed in the substrate under the gate electrode 54. Also, the impurity concentration of the $N^{--}$ source/drain region 53 is lower than that of $N^-$ source and drain regions 56 and 56' and is higher than that of impurity region 51.

FIG. 5 shows a process of forming $N^+$ source/drain 60 and 60'.

After removing the photoresist pattern PR, an insulation material is deposited on the whole surface of the resultant structure. Subsequently, an insulation spacer 58 is formed on the sidewalls of the gate electrode 54 by anisotropic-etching the insulation material. Then, by implanting $N^+$-type impurity ions, e.g., arsenic ions, using the gate electrode 54 and insulation spacer 58 as a mask, $N^+$ source and drain regions 60 and 60' are formed on the substrate 50. At this time, the $N^+$ source and drain regions 60 and 60' are formed so as to be respectively included in the $N^-$ source and drain regions 56 and 56'. The insulation spacer 58 is formed so as to cover the predetermined surface of the $N^-$ source region 56 not being contacted with the $N^+$ source region 60 and the predetermined surface of the $N^-$ drain region 56' not being contacted with the $N^+$ drain region 60'.

According to the aforementioned embodiment of the present invention, since the $N^{--}$ source/drain region is formed on the substrate surface under gate electrode 54 and has a width ranging from the edge portion of the gate electrode to the center thereof by a first distance, a deep depletion of the source/drain junction portion is reduced. Also, since the width of the depletion is increased, the electric field applied to the drain region is reduced. Also, since the $N^-$ source/drain region is controlled by a gate voltage to decrease a degradation of transistor characteristics due to a carrier trap, a high reliability on a hot carrier can be achieved. Also, since the $N^-$ source and drain regions having deep junction portion are formed by a high energy ion implantation, an additional diffusion process is not required after conducting the $N^-$ source/drain ion implantation. Therefore, the performance degradation of other transistor types, e.g., low-voltage transistors, can be prevented.

Figure 6:
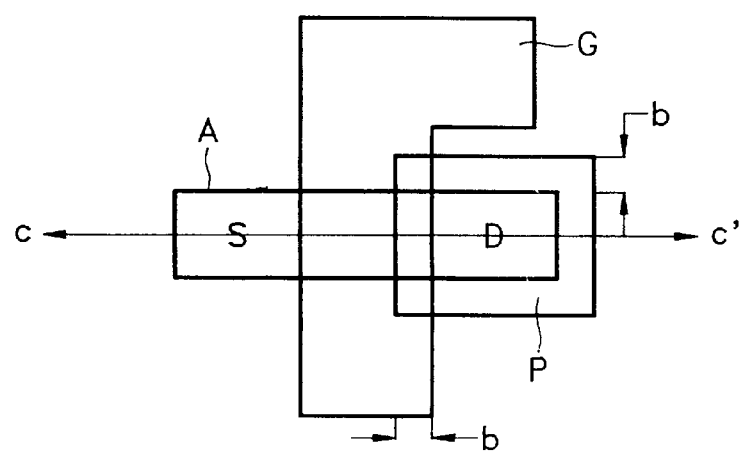
FIG. 6 is a plan view of a high-voltage transistor according to another embodiment of the present invention.

FIG. 6 is a plan view of a high-voltage transistor according to another embodiment of the present invention and reference letters indicated therein are the same as those in FIG. 3.

As shown in FIG. 6, $N^-$ source/drain ion implantation pattern P is formed only on the drain region D to which a high voltage is applied.

Figure 7:
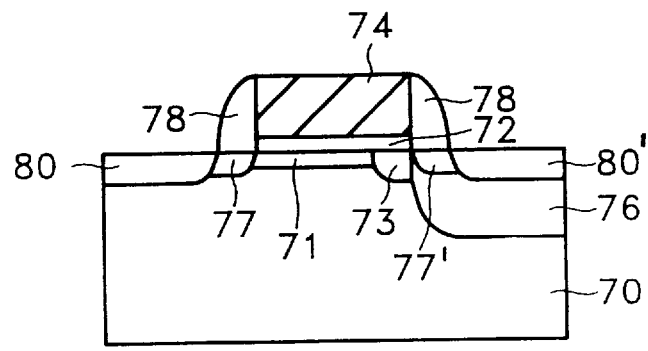
FIG. 7 is a cross-sectional view along a line cc' of FIG. 6 for explaining a method for manufacturing the high-voltage transistor according to another embodiment of the present invention.

FIG. 7 is a cross-sectional view along a line cc' of FIG. 6 for explaining a method for manufacturing the high-voltage transistor according to another embodiment of the present invention.

Referring to FIG. 7, the processes of forming $P^-$-type impurity region 71, oxide film 72 and gate electrode 74 are the same as those in the first embodiment.

After forming the gate electrode 74, by implanting $N^-$-type impurity ions, e.g., phosphorus or arsenic ions, using the gate electrode 74 as a mask, $N^-$ source and drain regions 77 and 77' are formed on the substrate 70. Subsequently, a photoresist pattern (not shown) is formed on the resultant structure so as to cover the $N^-$-region (77) and one part of the gate electrode (74) and to expose $N^-$-region (77') and the other part of the gate electrode 74 wherein the width of the exposed gate electrode corresponds to a predetermined distance b, e.g., 0.2~1.0 $\mu$m, from one edge of the gate electrode 74 near the $N^-$ drain region 77' toward the center thereof. Subsequently, using the photoresist pattern as a mask, $N^-$-type impurity ions, e.g., phosphorus ions, are implanted with a high energy, thereby forming $N^-$ and $N^{--}$ regions 76 and 73 surrounding the $N^-$ drain region 77' at the same time. At this time, the $N^-$ region 73, formed in the surface of substrate 70 under the gate electrode 74, is a tail portion of impurity profile produced by a high energy ion implantation and extends from the edge of the gate electrode 74 of the $N^-$ drain region to the center thereof by a first distance. Also, the concentration of the $N^-$ region 76 is the same as that of $N^-$ source region 77 and is lower than that of the $N^-$ drain region 77'. The concentration of the $N^-$ region 73 is lower than that of the $N^-$ region 76 and is higher than that of the $P^-$-type impurity region 71. Next, after removing the photoresist pattern, an insulation spacer 78 and $N^+$-type source and drain regions 80 and 80' are formed by the method described in connection with FIG. 5. Here the impurity concentration is the same for the N⁺-type source and drain regions 80 and 80' which is higher than that of the N⁻ drain region 77'.

According to the aforementioned embodiment of the present invention, the N⁻ source/drain ion implantation is conducted only with respect to the drain region to which a high voltage is applied like in the N⁻ source/drain ion implantation for a high-voltage transistor. As the result, since the layout space is greatly reduced with respect to the first embodiment, the integration of semiconductors is considerably increased.

Figure 8:
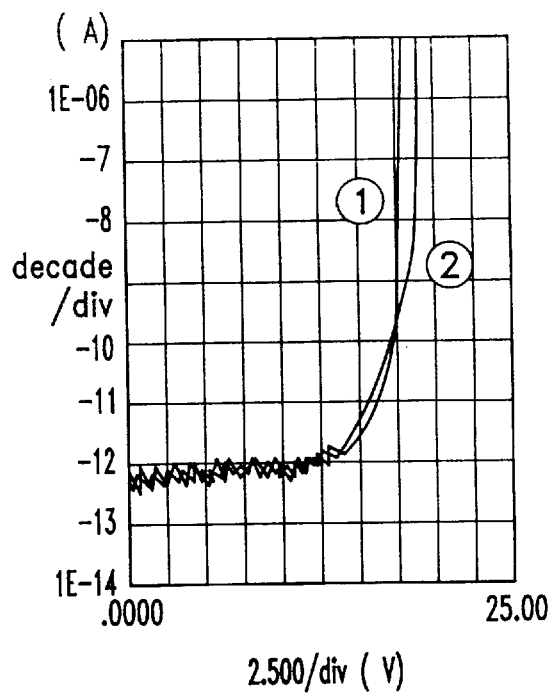
FIG. 8 is a graph showing the breakdown voltage characteristics of high-voltage transistors manufactured by the conventional method and the present invention.

FIG. 8 is a graph showing breakdown voltage characteristics of the high-voltage transistors manufactured by the conventional method and the present invention.

Figure 1:
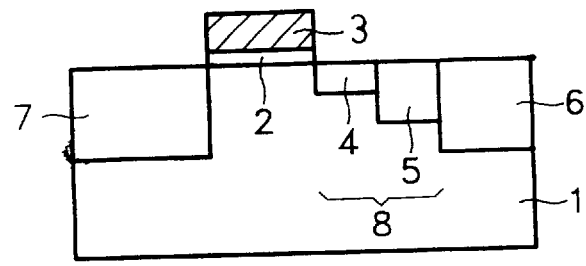
FIG. 1 is a cross-sectional view of a conventional high-voltage transistor.
Figure 2:
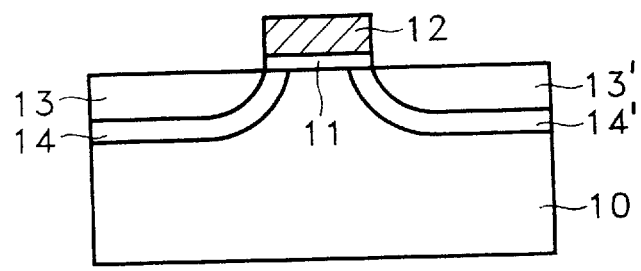
FIG. 2 is a cross-sectional view of a conventional high-voltage transistor having a doubly diffused drain (DDD) structure.

Referring to FIG. 8 in which the horizontal axis indicates the breakdown voltage and the vertical axis indicates the leakage current, ① indicates a breakdown voltage characteristic of the DDD transistor described in FIG. 2 and it is appreciated that the breakdown voltage at which a drain leakage current of 1 μA flows is 17.75V. ② indicates a breakdown voltage characteristic of the transistor manufactured according to the present invention and it is appreciated that the breakdown voltage at which a drain leakage current of 1 μA flows is 19V. Therefore, it is understood that the transistor according to the present invention has an increased breakdown voltage with respect to that by the conventional method.

As described above, according to the present invention, since the width of the depletion layer of the source/drain junction portion is increased due to the N⁻⁻ source and drain regions 53 and 73 extending from the edge portion of the gate electrode toward the center thereof by a first predetermined distance and formed on the surface of the substrate under the gate electrode, the electric field applied to the drain region can be reduced. Also, since the N⁻⁻ region is formed only on the drain region to which a high voltage is applied, the layout space can become smaller. Therefore, the integration of semiconductor devices can be increased.

It is apparent that the present invention is not limited to the foregoing examples but numerous changes thereof may be made by those skilled in the art within the spirit of the invention.

What is claimed is:

1. A MOS transistor manufacturing method comprising the steps of:

implanting first impurity ions of a first conductivity type on a semiconductor substrate of the first conductivity type, to form a first impurity region of a first impurity concentration thereon;

sequentially forming a gate insulation film and a gate electrode on said semiconductor substrate;

implanting second impurity ions of a second conductivity type being opposite to the first conductivity type, on the resultant structure on which said gate insulation film and gate electrode are formed, to form second and third impurity regions on said semiconductor substrate, each having a second impurity concentration and a third impurity concentration;

forming a photoresist pattern to cover the part of gate electrode and the substrate where said second impurity region is formed and to expose the other part of said gate electrode and the substrate where said third impurity region is formed;

implanting third impurity ions of the second conductivity on the resultant structure on which said photoresist pattern is formed, to form a fourth impurity region having a fourth impurity concentration lower than said second impurity concentration on said semiconductor substrate and having a first distance extending from one edge of said gate electrode near said third impurity region toward the center thereof, and at the same time forming a fifth impurity region surrounding said third impurity region with a junction portion thereof being formed below said third impurity region, contacting said fourth impurity region, and having the second impurity concentration;

removing said photoresist pattern;

forming an insulation spacer on each sidewall of said gate electrode; and implanting fourth impurity ions of the second conductivity type on the resultant structure on which said insulation spacer is formed, to form sixth and seventh impurity regions each having a fifth impurity concentration being higher than the second impurity concentration.

2. A MOS transistor manufacturing method as claimed in claim 1, wherein the fourth impurity concentration of said fourth impurity region is higher than the first impurity concentration of said first impurity region.

3. A MOS transistor manufacturing method as claimed in claim 1, wherein the first predetermined distance is 0.2~1.0 μm.

4. A MOS transistor manufacturing method as claimed in claim 1, wherein the first conductivity type is a P-type and the second conductivity type is an N-type.

5. A MOS transistor manufacturing method as claimed in claim 1, wherein the first conductivity type is an N-type and the second conductivity type is a P-type.

6. A MOS transistor manufacturing method as claimed in claim 1, wherein phosphorus is used as the second and third impurities and arsenic is used as the fourth impurity.

7. A MOS transistor manufacturing method as claimed in claim 4, wherein phosphorus is used as the second and third impurities and arsenic is used as the fourth impurity.

8. A MOS transistor manufacturing method as claimed in claim 4, wherein phosphorus is used as the third impurity and arsenic is used as the second and fourth impurities.

9. A MOS transistor manufacturing method as claimed in claim 4, wherein phosphorus is used as the third impurity and arsenic is used as the second and fourth impurities.

10. A MOS transistor manufacturing method comprising the steps of:

implanting first impurity ions of a first conductivity type on a semiconductor substrate of the first conductivity type, to form a first impurity region of a first impurity concentration thereon;

implanting second impurity ions of a second conductivity type, being opposite to the first conductivity type, on said substrate to form a second impurity region contacting with one side of said first impurity region and at the same time to form a third impurity region being apart from the other side of said first impurity region by a first distance, said second and third impurity regions respectively having a second impurity concentration and a third impurity concentration;

implanting third impurity ions of the second conductivity to form a fourth impurity region between said first and third impurity regions to contact therewith and having a width corresponding to said first distance, and having a fourth impurity concentration lower than that of said second impurity concentration, and at the same time forming a fifth impurity region surrounding said third impurity region with a junction third portion thereof being formed below said third impurity, region contacting said fourth impurity regions, and having the second impurity concentration; and implanting fourth impurity ions of the second conductivity type, to form a sixth and seventh impurity regions each having a fifth impurity concentration being higher than the second impurity concentration and being surrounded by said second and third impurity regions.

11. A MOS transistor manufacturing method as claimed in claim 10, wherein the fourth impurity concentration of said fourth impurity regions is higher than the first impurity concentration of said first impurity region.

12. A MOS transistor manufacturing method as claimed in claim 10, wherein the first distance is 0.2~1.0 μm.

13. A MOS transistor manufacturing method as claimed in claim 10, said fourth and fifth impurity regions are formed by the steps of forming a photoresist pattern so as to cover the substrate on said second impurity region, and on one part of a gate electrode formed on the substrate and to expose the substrate on said third impurity region and the other part of said gate electrode; and implanting said second impurity ions into said substrate.

14. A MOS transistor manufacturing method as claimed in claim 13, wherein a width of the exposed gate electrode corresponds with the width of said fourth impurity region.

15. A MOS transistor manufacturing method as claimed in claim 10, said sixth and seventh impurity regions are formed by the steps of: sequentially forming a gate insulation film and a gate electrode on said semiconductor substrate; forming an insulation spacer on sides of said gate electrodes; and implanting said fourth impurity ions by using said gate electrode and said gate insulation film as mask.

* * * * *